(12) United States Patent
Sakurai (10) Patent No.: US 11,145,585 B2
(45) Date of Patent: Oct. 12, 2021

(54) WIRING BOARD HAVING EACH PAD WITH TAPERED SECTION CONTINUOUSLY FORMED ON COLUMNAR SECTION

(71) Applicant: SHINKO ELECTRIC INDUSTRIES CO., LTD., Nagano (JP)

(72) Inventor: Daisuke Sakurai, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 10 days.

(21) Appl. No.: 16/814,180

(22) Filed: Mar. 10, 2020

(65) Prior Publication Data
US 2020/0294903 A1    Sep. 17, 2020

(30) Foreign Application Priority Data
Mar. 13, 2019  (JP) .............................. JP2019-045783

(51) Int. Cl.
*H01L 23/498*  (2006.01)
*H01L 23/00*   (2006.01)
*H01L 21/48*   (2006.01)

(52) U.S. Cl.
CPC .... *H01L 23/49827* (2013.01); *H01L 21/4857* (2013.01); *H01L 23/49816* (2013.01); *H01L 23/49822* (2013.01); *H01L 23/49838* (2013.01); *H01L 23/49894* (2013.01); *H01L 24/16* (2013.01); *H01L 2224/16227* (2013.01)

(58) Field of Classification Search
CPC ......... H01L 23/49838; H01L 23/49822; H01L 23/49894; H01L 24/16; H01L 21/4857; H01L 23/49827; H01L 23/49816
See application file for complete search history.

(56) References Cited

U.S. PATENT DOCUMENTS

| | | | |
|---|---|---|---|
| 8,729,406 B2 | 5/2014 | Ko | |
| 2006/0046468 A1* | 3/2006 | Akram | H01L 25/50 438/637 |
| 2012/0124830 A1* | 5/2012 | Cheng | H05K 3/4007 29/846 |
| 2013/0270699 A1* | 10/2013 | Kuo | H01L 23/49816 257/738 |
| 2015/0214182 A1* | 7/2015 | Pendse | H01L 24/81 257/737 |
| 2016/0021744 A1* | 1/2016 | Baek | H01L 23/49811 174/250 |
| 2016/0190082 A1* | 6/2016 | Tsai | H01L 24/17 257/737 |
| 2016/0240503 A1* | 8/2016 | Shu | H01L 23/49816 |

(Continued)

FOREIGN PATENT DOCUMENTS

JP    2011-035359    2/2011

*Primary Examiner* — Michael Jung
(74) *Attorney, Agent, or Firm* — IPUSA, PLLC (57) ABSTRACT

A wiring board includes a semiconductor chip mounting surface, an external connection surface provided on an opposite side from the semiconductor chip mounting surface, and pads provided on the semiconductor chip mounting surface. Each pad includes a columnar section, and a tapered section, continuously formed on a first end of the columnar section, and having a cross sectional area that decreases toward a direction away from the columnar section. The tapered section of each pad projects from the semiconductor chip mounting surface.

17 Claims, 6 Drawing Sheets

(56) References Cited

U.S. PATENT DOCUMENTS

| | | | |
|---|---|---|---|
| 2016/0242285 A1* | 8/2016 | Katsuno | H05K 3/007 |
| 2016/0276255 A1* | 9/2016 | Ota | H01L 23/49816 |
| 2017/0372997 A1* | 12/2017 | Tsukamoto | H01L 23/3128 |
| 2018/0184521 A1* | 6/2018 | Kitajo | H05K 3/0035 |
| 2019/0035753 A1* | 1/2019 | Shih | H01L 24/14 |
| 2019/0164862 A1* | 5/2019 | Kim | H01L 23/13 |
| 2019/0311979 A1* | 10/2019 | Lu | H01L 21/0272 |

* cited by examiner

WIRING BOARD HAVING EACH PAD WITH TAPERED SECTION CONTINUOUSLY FORMED ON COLUMNAR SECTION

CROSS-REFERENCE TO RELATED APPLICATION

This application is based upon and claims priority to Japanese Patent Application No. 2019-045783, filed on Mar. 13, 2019, the entire contents of which are incorporated herein by reference.

FIELD

Certain aspects of the embodiments discussed herein are related to a wiring board, and a method of manufacturing the wiring board.

BACKGROUND

Wiring boards having pads electrically connected to a semiconductor chip are known. In such wiring boards, there are cases where surfaces of the pads to be electrically connected to the semiconductor chip coincide with a surface of an insulating layer that is provided on a side where the semiconductor chip is mounted. In such cases, when the semiconductor chip is mounted using a solder, adjacent pads may become short-circuited because excess solder spreads laterally on the surface of the insulating layer.

Accordingly, in a structure that is being studied, the pads to be electrically connected to the semiconductor chip project from the surface of the insulating layer that is provided on the side where the semiconductor chip is mounted. According to this structure, because the excess solder spreads around side surfaces of the pads that project from the surface of the insulating layer when mounting the semiconductor chip, the possibility of short-circuiting the adjacent pads may be reduced.

However, in recent years, the pads to be electrically connected to the semiconductor chip are arranged at a pitch that continues to be reduced. For this reason, further studies are required to reduce the possibility of short-circuiting the adjacent pads when mounting the semiconductor chip.

An example of a printed circuit board is described in Japanese Laid-Open Patent Publication No. 2011-035359 (now Japanese Patent No. 5258716).

SUMMARY

Accordingly, it is an object in one aspect of the embodiments to provide a wiring board having pads that are shaped so that the possibility of short-circuiting the adjacent pads can be reduced when mounting a semiconductor chip.

According to one aspect of the embodiments, a wiring board includes a semiconductor chip mounting surface; an external connection surface provided on an opposite side from the semiconductor chip mounting surface; and a plurality of pads provided on the semiconductor chip mounting surface, wherein each of the plurality of pads includes a columnar section, and a tapered section, continuously formed on a first end of the columnar section, and having a cross sectional area that decreases toward a direction away from the columnar section, wherein the tapered section of each of the plurality of pads projects from the semiconductor chip mounting surface.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Preferred embodiments of the present invention will be described with reference to the accompanying drawings. In the drawings, those parts that are the same are designated by the same reference numerals, and a repeated description of the same parts may be omitted.

[Structure of Wiring Board]

Figure 1A:
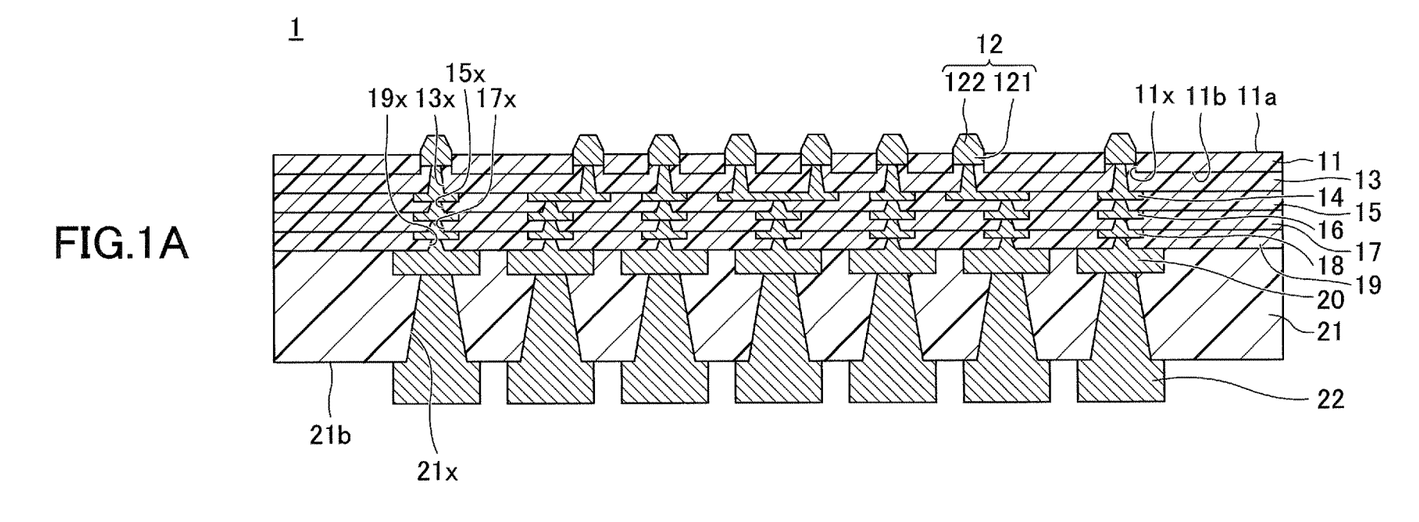
FIG. 1A and FIG. 1B are diagrams illustrating an example of a wiring board according to one embodiment.
Figure 1B:
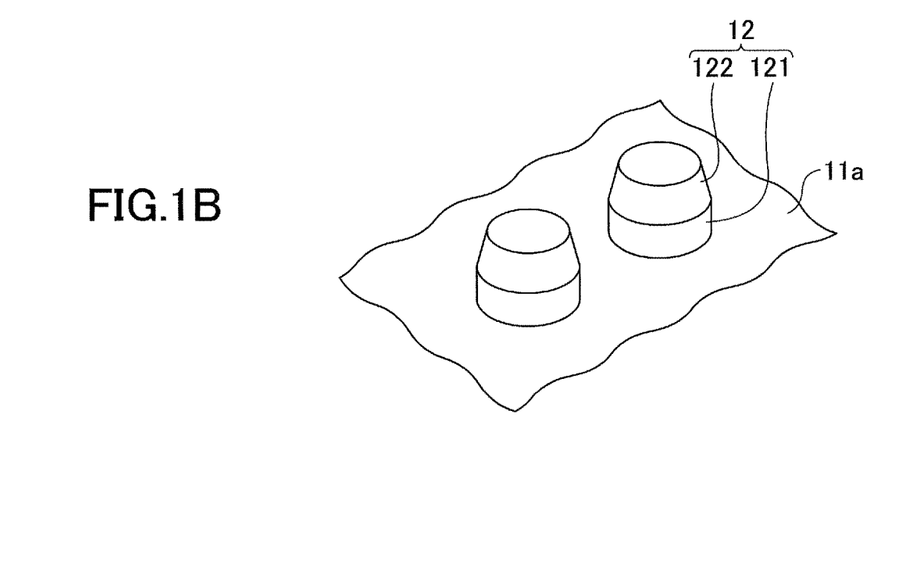

First, a structure of a wiring board according to one embodiment will be described. FIG. 1A and FIG. 1B are diagrams illustrating an example of the wiring board according to one embodiment. FIG. 1A is a cross sectional view, and FIG. 1B is a partial enlarged perspective view of a vicinity of pads 12 illustrated in FIG. 1A.

As illustrated in FIG. 1A and FIG. 1B, a wiring board 1 includes an insulating layer 11, the pads 12, an insulating layer 13, an interconnect layer 14, an insulating layer 15, an interconnect layer 16, an insulating layer 17, an interconnect layer 18, an insulating layer 19, an interconnect layer 20, an insulating layer 21, and an interconnect layer 22. A planar shape of the wiring board 1 may be a square shape, for example. However, the planar shape of the wiring board 1 is not limited to the square shape, and the wiring board 1 may have an arbitrary planar shape.

In this embodiment, it is assumed for the sake of convenience that the side of the wiring board 1 provided with the pads 12 is an upper side or one side of the wiring board 1, and that the side of the wiring board 1 provided with the interconnect layer 22 is a lower side or the other side of the wiring board 1. In addition, it is also assumed for the sake of convenience that the surface of each constituent element on the side of the pads 12 is one surface or an upper surface of the constituent element, and that the surface of each constituent element on the side of the interconnect layer 22 is the other surface or a lower surface of the constituent element. However, the wiring board 1 may of course be used in an upside-down state, or in a state arranged at an arbitrary angle. In addition, a plan view refers to a top view of a target element viewed in a normal direction to an upper surface 11a of the insulating layer 11. The planar shape refers to a shape of the target element in the plan view, that is, the shape in the top view of the target element viewed in the normal direction to the upper surface 11a of the insulating layer 11.

The wiring board 1 includes a semiconductor chip mounting surface, and an external connection surface provided on the opposite side from the semiconductor chip mounting surface. The upper surface 11a of the insulating layer 11 becomes the semiconductor chip mounting surface, and a lower surface 21b of the insulating layer 21 becomes the external connection surface. One or a plurality of semiconductor chips may be mounted on the side of the semiconductor chip mounting surface of the wiring board 1, and another wiring board or a semiconductor device may be connected to the side of the external connection surface of the wiring board 1.

The insulating layer is made of a material including a photosensitive insulating resin as a main component thereof. The material including the photosensitive insulating resin as the main component thereof, may include a component other than the photosensitive insulating resin, such as a filler or the like. For example, the insulating layer 11 may be made of a material including a filler such as silica ($SiO_2$) or the like. Examples of the photosensitive insulating resin used for the insulating layer 11 include phenol resins, polyimide resins, or the like, for example. The insulating layer 11 may have a thickness of approximately 5 μm to approximately 10 μm, for example.

The pads 12 to be electrically connected to the semiconductor chip, are provided on and project from the side of the semiconductor chip mounting surface of the wiring board 1 (that is, from the side of the upper surface 11a of the insulating layer 11). The pads 12 may be arranged in an area-array arrangement in which the pads 12 are arranged in an array within a predetermined area, or a peripheral arrangement in which the pads 12 are arranged in a peripheral portion of a predetermined area, for example. Examples of a material used for the pads 12 include copper (Cu), or the like, for example.

Each pad 12 includes a columnar section 121 having an approximately constant cross sectional area, and a tapered section 122 that is continuously formed on one end of the columnar section 121. The cross sectional area of the tapered section 122 decreases toward a direction away from the columnar section 121. A tip end of the tapered section 122 is flat. The columnar section 121 has a cylindrical shape, for example, and the tapered section 122 has a truncated cone shape, for example. In this case, a diameter of the columnar section 121 may be approximately 25 μm, for example, and a diameter of an upper surface of the tapered section 122 may be approximately 20 μm, for example. In addition, a pitch (or interval) of the pads 12 may be approximately 40 μm, for example.

A portion of the columnar section 121 is covered by the insulating layer 11, and other portions of the columnar section 121 and the tapered section 122 project from the upper surface 11a of the insulating layer 11. A total height of the other portions of the columnar section 121 and the tapered section 122 that project from the upper surface 11a of the insulating layer 11 (that is, a projecting amount from the upper surface 11a), is approximately 10 μm, for example. In this case, a ratio of the height of the other portions of the columnar section 121, and the height of the tapered section 122, is not particularly limited, and may be determined appropriately. For example, the ratio of the height of the other portions of the columnar section 121, and the height of the tapered section 122, may be 1:1, for example. For example, the height of the other portions of the columnar section 121 may be 5 μm, and the height of the tapered section 122 may be 5 μm. Moreover, a height of the portion of the columnar section 121 covered by the insulating layer 11 may be 5 μm, for example.

The insulating layer 13 that makes contact with the lower surface 11b of the insulating layer 11 is arranged under the insulating layer 11. The material and thickness of the insulating layer 13 may be similar to the material and thickness of the insulating layer 11, for example. The insulating layer 13 may be made of a material including a filler such as silica ($SiO_2$) or the like. The insulating layer 11 has recesses 11x that respectively cave inward from the lower surface 11b, and a bottom surface of each recess 11x is formed by the other end of the corresponding columnar section 121. The insulating layer 13 fills the inside of the recess 11x. A via interconnect that forms the interconnect layer 14 which will be described later, penetrates the insulating layer 13 filling the inside of the recess 11x, and makes contact with the other end of the columnar section 121. However, the recesses 11x of the insulating layer 11 may be omitted. In this case, the lower surface lib of the insulating layer 11 and the other end of the columnar section 121 can be made to coincide, for example.

The interconnect layer 14 is formed on the side of a lower surface of the insulating layer 13, and is electrically connected to the pad 12. The interconnect layer 14 includes an interconnect pattern formed on the lower surface of the insulating layer 13, and the via interconnect formed integrally with the interconnect pattern and filling the inside of a via hole 13x that penetrates the insulating layer 13 and exposes the other end of the columnar section 121 of the pad 12. The via hole 13x may be formed as a cavity having a truncated cone shape such that a diameter of an opening that opens to the side of the insulating layer 15 is larger than a diameter of a bottom surface of an opening that is formed by the other end of the columnar section 121. In other words, the via interconnect forming the interconnect layer 14 may have a tapered shape (for example, a truncated cone shape) having a cross sectional area that decreases from the side of the interconnect pattern forming the interconnect layer 14 toward the side of the other end of the columnar section 121.

Examples of a material used for the interconnect layer 14 include copper (Cu) or the like, for example. The interconnect layer 14 may have a laminated structure that is formed by a plurality of conductor layers that are laminated. The interconnect layer 14 has an interconnect density higher than the interconnect densities of the interconnect layers 20 and 22 which will be described later, and is thinner than the interconnect layers 20 and 22. In other words, the interconnect layer 14 has a line-and-space (L/S) narrower than the line-and-space (L/S) of the interconnect layers 20 and 22. In this specification, the interconnect layer having the L/S that is 8 μm/8 μm or less will be referred to as an interconnect layer having a high interconnect density. The L/S of the interconnect layer 14 may be approximately 1 μm/1 μm to approximately 3 μm/3 μm, for example. The thickness of the interconnect pattern forming the interconnect layer 14 may be approximately 1 μm to approximately 3 μm, for example.

The line (L) of the L/S represents an interconnect width, and the space (S) of the L/S represents a spacing between two mutually adjacent interconnects (or interconnect pitch). For example, the L/S that is 2 μm/2 μm indicates that the interconnect width is 2 μm, and the spacing between two mutually adjacent interconnects is 2 μm.

The insulating layer 15, that covers the interconnect pattern of the interconnect layer 14 and makes contact with the lower surface of the insulating layer 13, is arranged under the insulating layer 13. The material and thickness of the insulating layer 15 may be similar to the material and thickness of the insulating layer 11, for example. The insulating layer 15 may be made of a material including a filler such as silica ($SiO_2$) or the like.

The interconnect layer 16 is formed on the side of a lower surface of the insulating layer 15, and is electrically connected to the interconnect layer 14. The interconnect layer 16 includes an interconnect pattern formed on the lower surface of the insulating layer 15, and a via interconnect formed integrally with the interconnect pattern and filling the inside of a via hole 15x that penetrates the insulating layer 15 and exposes a lower surface of the interconnect pattern of the interconnect layer 14. The via hole 15x may be formed as a cavity having a truncated cone shape such that a diameter of an opening that opens to the side of the insulating layer 17 is larger than a diameter of a bottom surface of an opening that is formed by the lower surface of the interconnect pattern of the interconnect layer 14. The material of the interconnect layer 16 and the thickness of the interconnect pattern forming the interconnect layer 16 may be similar to the material of the interconnect layer 14 and the thickness of the interconnect pattern forming the interconnect layer 14, for example. The L/S of the interconnect pattern forming the interconnect layer 16 may be similar to the L/S of the interconnect pattern forming the interconnect layer 14, for example.

The insulating layer 17, that covers the interconnect pattern of the interconnect layer 16 and makes contact with the lower surface of the insulating layer 15, is arranged under the insulating layer 15. The material and thickness of the insulating layer 17 may be similar to the material and thickness of the insulating layer 11, for example. The insulating layer 17 may be made of a material including a filler such as silica ($SiO_2$) or the like.

The interconnect layer 18 is formed on the side of a lower surface of the insulating layer 17, and is electrically connected to the interconnect layer 16. The interconnect layer 18 includes an interconnect pattern formed on the lower surface of the insulating layer 17, and a via interconnect formed integrally with the interconnect pattern and filling the inside of a via hole 17x that penetrates the insulating layer 17 and exposes a lower surface of the interconnect pattern of the interconnect layer 16. The via hole 17x may be formed as a cavity having a truncated cone shape such that a diameter of an opening that opens to the side of the insulating layer 19 is larger than a diameter of a bottom surface of an opening that is formed by the lower surface of the interconnect pattern of the interconnect layer 16. The material of the interconnect layer 18 and the thickness of the interconnect pattern forming the interconnect layer 18 may be similar to the material of the interconnect layer 14 and the thickness of the interconnect pattern forming the interconnect layer 14, for example. The L/S of the interconnect pattern forming the interconnect layer 18 may be similar to the L/S of the interconnect pattern forming the interconnect layer 14, for example.

The insulating layer 19, that covers the interconnect pattern of the interconnect layer 18 and makes contact with the lower surface of the insulating layer 17, is arranged under the insulating layer 17. The material and thickness of the insulating layer 19 may be similar to the material and thickness of the insulating layer 11, for example. The insulating layer 19 may be made of a material including a filler such as silica ($SiO_2$) or the like.

The interconnect layer 20 is formed on the side of a lower surface of the insulating layer 19, and is electrically connected to the interconnect layer 18. The interconnect layer 20 includes an interconnect pattern formed on the lower surface of the insulating layer 19, and a via interconnect formed integrally with the interconnect pattern and filling the inside of a via hole 19x that penetrates the insulating layer 19 and exposes a lower surface of the interconnect pattern of the interconnect layer 18. The via hole 19x may be formed as a cavity having a truncated cone shape such that a diameter of an opening that opens to the side of the insulating layer 21 is larger than a diameter of a bottom surface of an opening that is formed by the lower surface of the interconnect pattern of the interconnect layer 18.

Examples of a material used for the interconnect layer 20 include copper (Cu) or the like, for example. The interconnect pattern forming the interconnect layer 20 is thicker than the thicknesses of the interconnect layers 14, 16, and 18, and may be approximately 10 μm to approximately 20 μm, for example. The interconnect pattern forming the interconnect layer 20 has an interconnect density lower than the interconnect densities of the interconnect layers 14, 16, and 18. In other words, the L/S of the interconnect layer 20 is wider than the L/S of the interconnect layers 14, 16, and 18. The L/S of the interconnect pattern forming the interconnect layer 20 may be approximately 20 μm/20 μm, for example.

The insulating layer 21, that covers the interconnect pattern of the interconnect layer 20 and makes contact with the lower surface of the insulating layer 19, is arranged under the insulating layer 19. The insulating layer 21 is made of a material including a nonphotosensitive thermosetting resin as a main component thereof. The material including the nonphotosensitive thermosetting resin as the main component thereof, may include a component other than the nonphotosensitive thermosetting resin, such as a filler or the like. For example, the insulating layer 21 may be made of a material including a filler such as silica ($SiO_2$) or the like.

Examples of the nonphotosensitive thermosetting resin used for the insulating layer 21 include epoxy resins, imide resins, phenol resins, cyanate resins, or the like, for example. The insulating layer 21 may have a thickness of approximately 30 μm to approximately 100 μm, for example.

The insulating layer 21 may include a reinforcing member, such as woven fabrics of glass fiber, carbon fiber, aramid fiber, or the like, and nonwoven fabrics of glass fiber, carbon fiber, aramid fiber, or the like, for example.

In addition, the insulating layer 21 may have a laminated structure including a first layer made of a nonphotosensitive thermosetting resin that includes a reinforcing member, and a second layer made of a nonphotosensitive thermosetting resin that includes no reinforcing member and is laminated on both surfaces of the first layer, for example. In this case, the type and thickness of the thermosetting resin used for the two second layers may be determined independently. In other words, the same thermosetting resin may be used for the two second layers, or different thermosetting resins may be used for the two second layers. The two second layers may have the same thickness, or may have different thicknesses. In addition, one of the two second layers may include a filler, or both of the two second layers may include the filler. Furthermore, in a case where both of the two second layers include the filler, the type and content of the filler may be the same for the two second layers, or may be different between the two second layers.

The interconnect layer 22 is formed on the side of the lower surface 21b of the insulating layer 21, and is electrically connected to the interconnect layer 20. The interconnect layer 22 includes pads formed on the lower surface 21b of the insulating layer 21, and a via interconnect formed integrally with the pads and filling the inside of a via hole 21x that penetrates the insulating layer 21 and exposes the lower surface of the interconnect pattern of the interconnect layer 20. The via hole 21x may be formed as a cavity having a truncated cone shape such that a diameter of an opening that opens to the side of the lower surface 21b of the insulating layer 21 is larger than a diameter of a bottom surface of an opening that is formed by the lower surface of the interconnect pattern of the interconnect layer 20.

Examples of a material used for the interconnect layer 22 include copper (Cu) or the like, for example. The pads forming the interconnect layer 22 are thicker than the thicknesses of the interconnect layers 14, 16, and 18, and may be approximately 10 μm to approximately 20 μm, for example. The pads forming the interconnect layer 22 have a diameter larger than the diameter of the columnar section 121 of the pads 12, and the diameter of the pads forming the interconnect layer 22 may be approximately 150 μm, for example. The pitch of the pads forming the interconnect layer 22 may be approximately 200 μm, for example.

The lower surface 21b of the insulating layer 21 is the external connection surface, and the pads forming the interconnect layer 22 are electrically connectable to another wiring board or a semiconductor device.

[Method of Manufacturing Wiring Board]

Next, a method of manufacturing the wiring board will be described. FIG. 2A through FIG. 5C are diagrams illustrating examples of processes of manufacturing the wiring board according to one embodiment. Although the examples of the processes are employed to manufacture a single wiring board, it is of course possible to simultaneously manufacture a plurality of parts that become wiring boards on a single base, and thereafter cut the base into individual pieces that become the wiring boards. Because FIG. 2A through FIG. 4B are upside-down compared to FIG. 1A, the up side and the down side are reversed in the following description of FIG. 2A through FIG. 4B when compared to the description of FIG. 1A.

Figure 2A:
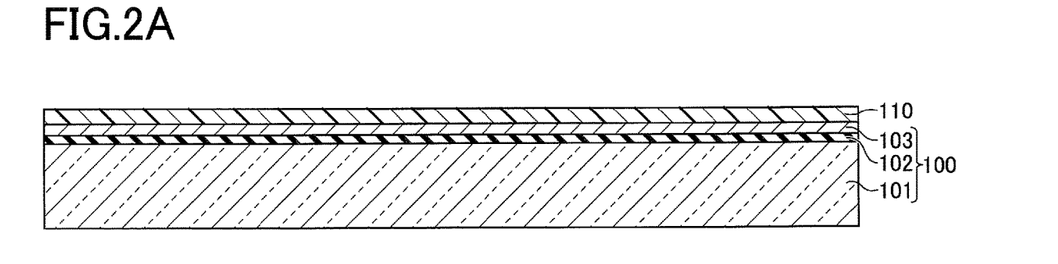
FIG. 2A, FIG. 2B, FIG. 2C, and FIG. 2D are diagrams illustrating examples of processes of manufacturing the wiring board according to one embodiment.

First, in the process illustrated in FIG. 2A, a substrate 100 is prepared by successively forming a release layer 102 and a metal layer 103 on a base 101, and a sacrificial layer 110 is formed on an upper surface of the metal layer 103. The base 101 is formed by a glass plate, a metal plate, or the like, for example. The metal layer 103 is a copper layer, for example. The metal layer 103 may have a laminated structure including a titanium layer laminated on a copper layer, for example. The metal layer 103 has a thickness of approximately 1 μm to approximately 5 μm, for example.

The sacrificial layer 110 is made of a photosensitive resin that is easily removable by a desmear process, for example. The sacrificial layer 110 may have a laminated structure including a ultraviolet curing release layer, and a photosensitive resin layer that is easily removed by the desmear process and laminated on the ultraviolet curing release layer. In addition, a thermosetting resin may be used for the sacrificial layer 110. The sacrificial layer 110 may have a thickness of approximately 10 μm, for example. The thickness of the sacrificial layer 110 is approximately the same as the final projecting amount of the pads 12 that project from the upper surface 11a of the insulating layer 11.

Figure 2B:
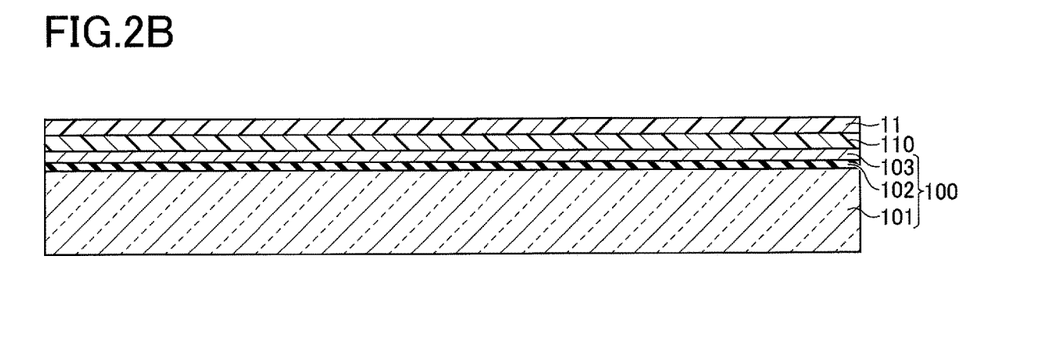

Next, in the process illustrated in FIG. 2B, the insulating layer 11 is formed on the sacrificial layer 110. More particularly, after coating the photosensitive insulating resin in the form of a liquid or a paste on the sacrificial layer 110, the insulating layer 11 in a semi-cured state is formed by heating to a temperature lower than the curing temperature so that the insulating layer 11 does not cure. The material and the thickness of the insulating layer 11 may be as described above.

Figure 2C:
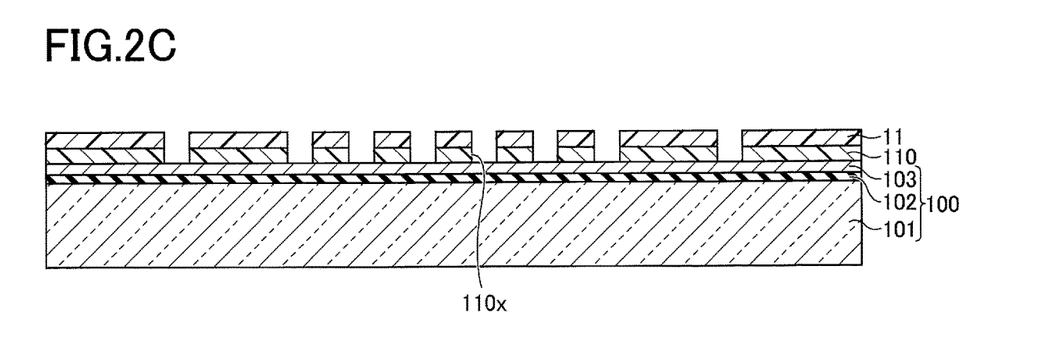

Next, in the process illustrated in FIG. 2C, openings 110x, that penetrate the insulating layer 11 and the sacrificial layer 110 and expose an upper surface of the metal layer 103, are formed by a photolithography technique, for example. After forming the openings 110x, the insulating layer 11 and the sacrificial layer 110 are heated to the curing temperature or higher, to cure the insulating layer 11. The openings 110x may be formed by laser machining or the like, instead of using the photolithography technique.

Figure 2D:
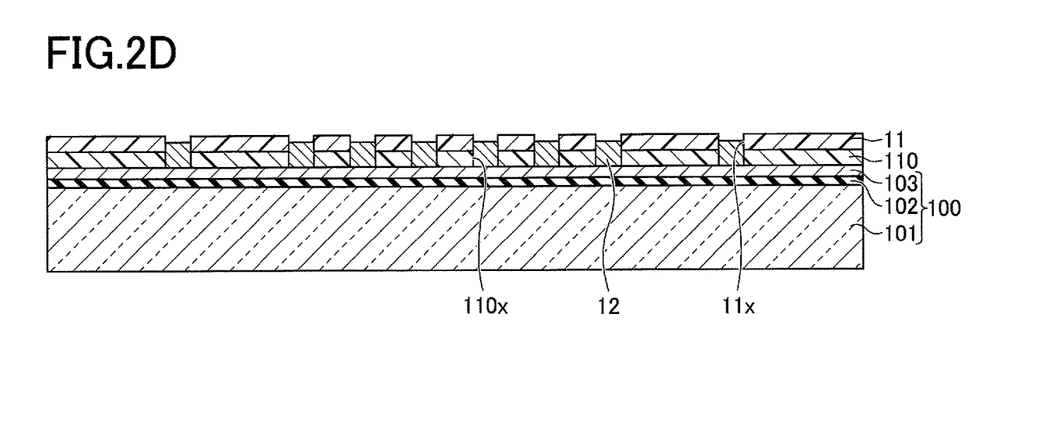

Next, in the process illustrated in FIG. 2D, pads 12, formed by an electroplated layer, are formed on the upper surface of the metal layer 103 exposed inside the openings 110x, by electroplating that uses the metal layer 103 as a feeder layer. The material, the thickness, the diameter, or the like of the pads 12 may be as described above. However, at this point in time, cross sectional areas of the pads 12 are approximately constant, and the shape of the pads 12 is a circular column shape, for example. The recesses 11x that expose the upper surfaces of the pads 12 are formed in the insulating layer 11. However, the recesses 11x of the insulating layer 11 may be omitted. In this case, the upper surface of the insulating layer 11 and the upper surfaces of the pads 12 can be made to coincide, for example.

Figure 3A:
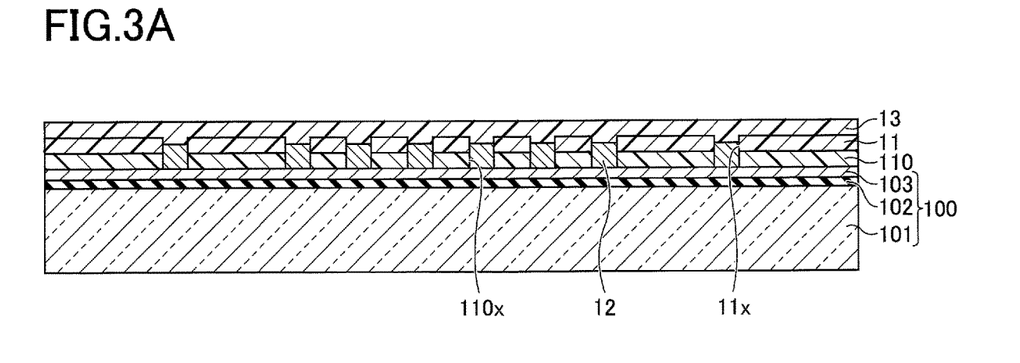
FIG. 3A, FIG. 3B, and FIG. 3C are diagrams illustrating examples of the processes of manufacturing the wiring board according to one embodiment.

Next, in the process illustrated in FIG. 3A, the insulating layer 13 is formed on the insulating layer 11 and inside the recesses 11x. The insulating layer 13 may be formed by a method similar to the method used to form the insulating layer 11. The material and the thickness of the insulating layer 13 may be as described above.

Figure 3B:
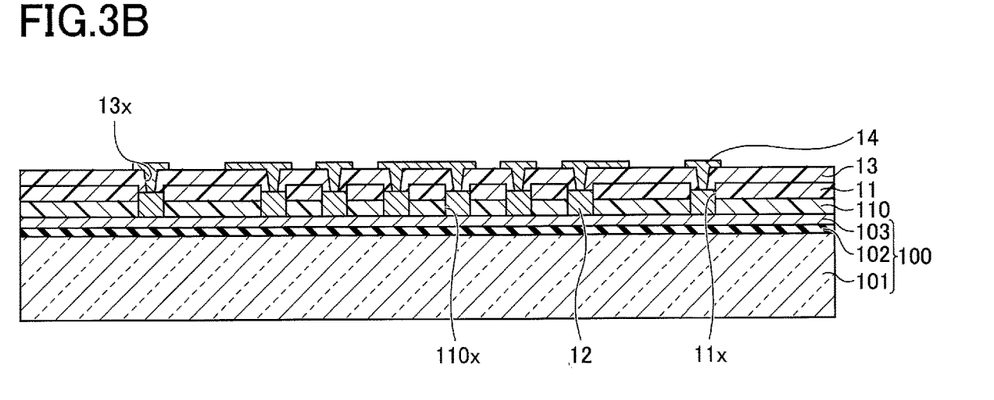

Next, in the process illustrated in FIG. 3B, after forming the via holes 13x in the insulating layer 13 by the photolithography technique, for example, the insulating layer 13 is heated to the curing temperature or higher, to cure the insulating layer 13. Then, the interconnect layer 14 is formed using a semiadditive process, for example. More particularly, a seed layer is first formed on the surface of the insulating layer 13 including an inner wall of the via holes 13x, and the surface of the pads 12 exposed inside the via holes 13x, by the electroplating or sputtering, for example.

A copper layer having a thickness of approximately 100 nm to approximately 350 nm, for example, may be used as the seed layer. In addition, a laminated structure including a titanium layer having a thickness of approximately 20 nm to approximately 50 nm, and a copper layer laminated on the titanium layer and having a thickness of approximately 100 nm to approximately 300 nm, for example, may be used as the seed layer. By forming the titanium layer as a lower layer of the seed layer having the laminated structure, it is possible to improve adhesion between the insulating layer 13 and the interconnect layer 14. The titanium layer of the laminated structure may be replaced by a titanium nitride layer or the like. Titanium and titanium nitride are metals having a higher corrosion resistance than copper.

Next, a photosensitive resist layer (for example, a dry film resist) is formed on the entire upper surface of the seed layer, and the resist layer is exposed and developed, to form openings that expose parts where the interconnect layer 14 is formed. Further, an electroplated layer (for example, a copper layer) is formed on the upper surface of the seed layer exposed inside the openings, by electroplating that uses the seed layer as the feeder layer. Next, after removing the resist layer, the electroplated layer is used as a mask, to remove parts of the seed layer, not covered by the electroplated layer, by etching. Accordingly, the interconnect layer 14, in which the electroplated layer is laminated on the seed layer, is formed.

Figure 3C:
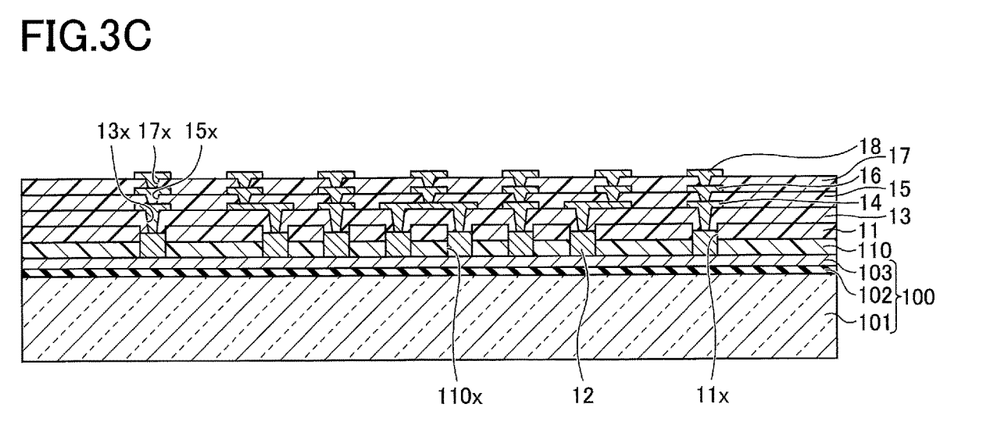

Next, in the process illustrated in FIG. 3C, processes similar to the processes of FIG. 3A and FIG. 3B are repeated, to successively form the insulating layer 15, the interconnect layer 16, the insulating layer 17, and the interconnect layer 18. The materials and the thicknesses of the insulating layer 15, the interconnect layer 16, the insulating layer 17, and the interconnect layer 18 may be as described above.

Figure 4A:
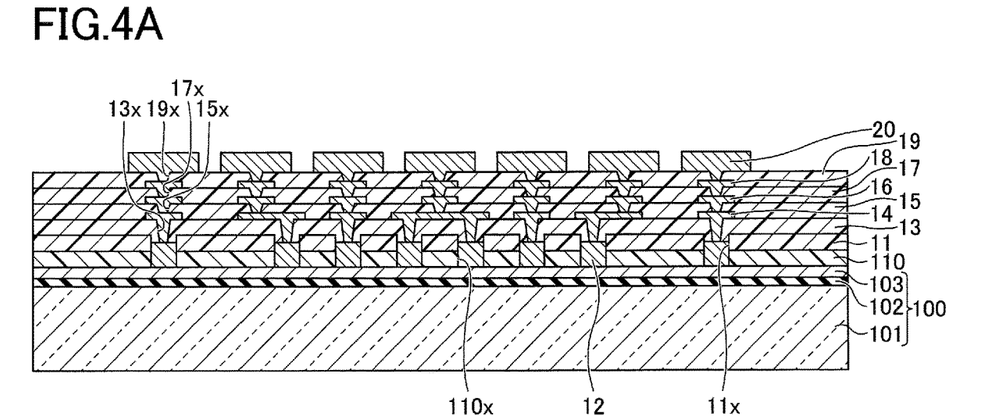
FIG. 4A, FIG. 4B, and FIG. 4C are diagrams illustrating examples of the processes of manufacturing the wiring board according to one embodiment.

Next, in the process illustrated in FIG. 4A, processes similar to the processes of FIG. 3A and FIG. 3B are repeated, to successively form the insulating layer 19 and the interconnect layer 20. The materials and the thicknesses of the insulating layer 19 and the interconnect layer 20 may be as described above.

Figure 4B:
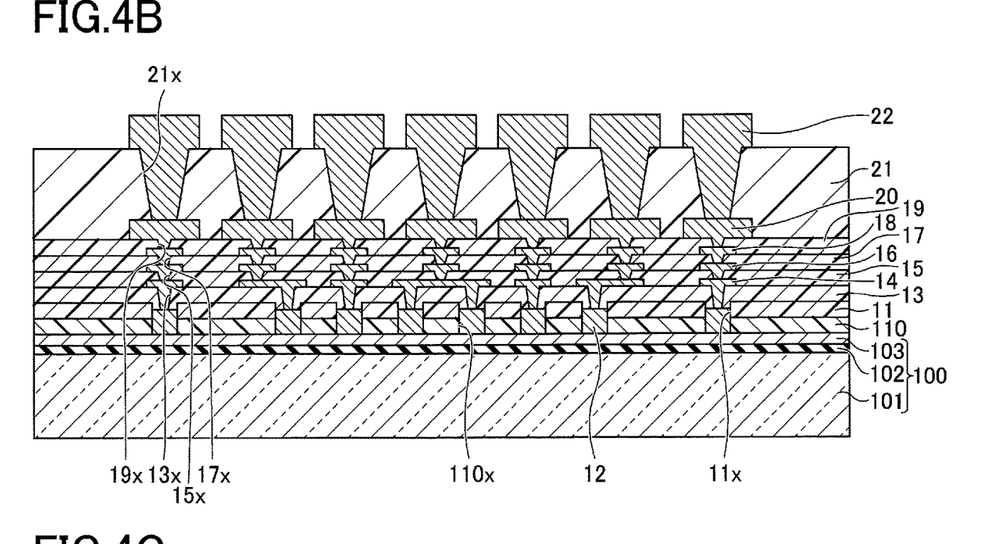

Next, in the process illustrated in FIG. 4B, the insulating layer 21 and the interconnect layer 22 are successively formed. When forming the insulating layer 21, an insulating resin film in a semi-cured state, including a nonphotosensitive thermosetting resin as a main component thereof, for example, is prepared. Then, this insulating resin film is laminated on the insulating layer 19 so as to cover the interconnect layer 20, and this insulating resin film is cured while applying heat and pressure thereon. The material and thickness of the insulating layer 21 may be as described above. In addition, as described above, the insulating layer 21 may have the laminated structure including the first layer made of the nonphotosensitive thermosetting resin that includes the reinforcing member, and the second layer made of the nonphotosensitive thermosetting resin that includes no reinforcing member and is laminated on both surfaces of the first layer, for example.

Next, the via holes 21x, that penetrate the insulating layer 21 and expose the upper surface of the interconnect layer 20, are formed in the insulating layer 21. The via holes 21x may be formed by laser machining, using $CO_2$ laser, YAG laser, excimer laser, or the like, for example. After forming the via holes 21x, a desmear process is preferably performed to remove resin residues adhered to the surface of the interconnect layer 20 exposed at the bottom portion of the via holes 21x.

Next, the interconnect layer 22 is formed using the semiadditive process, for example, similar to the above described process of forming the interconnect layer. The material and the thickness of the interconnect layer 22 may be as described above.

Figure 4C:
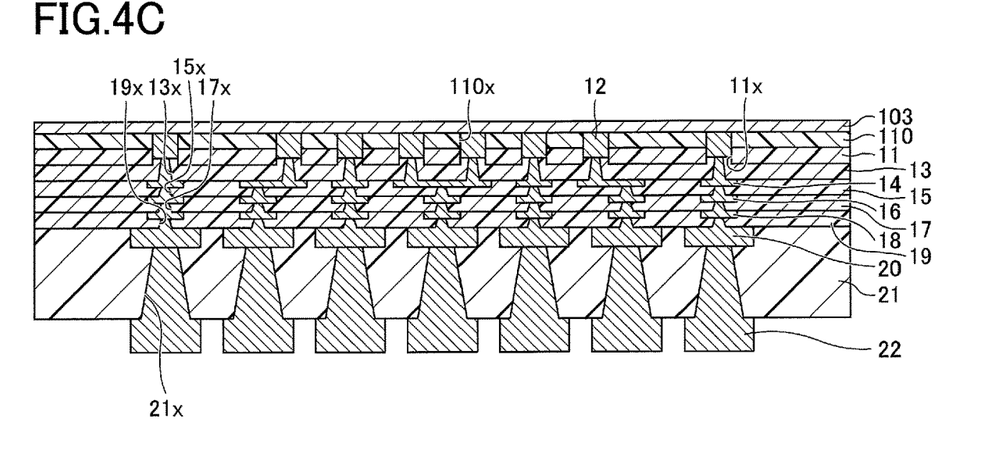

Next, in the process illustrated in FIG. 4C, the structure illustrated in FIG. 4B is turned upside-down, and the base 101 and the release layer 102 illustrated in FIG. 4B are removed. The base 101 and the release layer 102 can easily be removed by applying a mechanical force, due to the effects of the release layer 102. In other words, a main part of the substrate 100 can easily be removed.

Figure 5A:
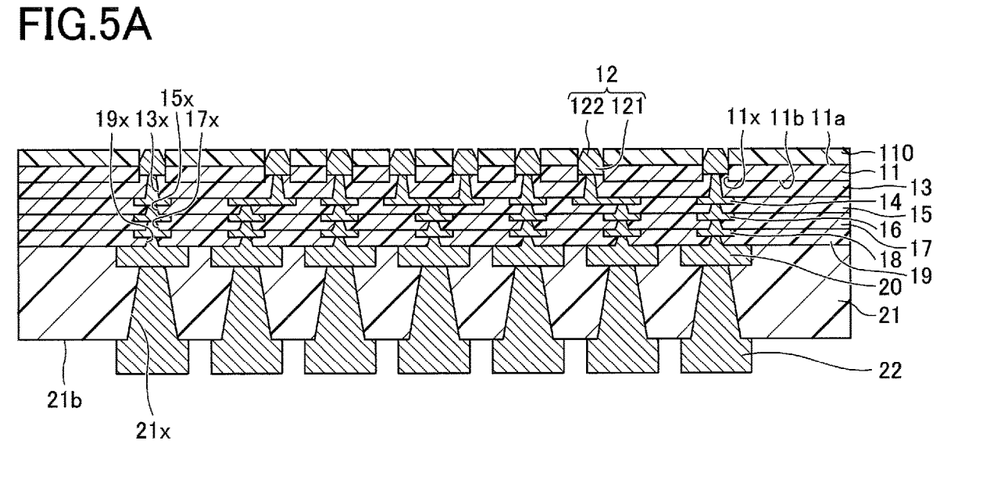
FIG. 5A, FIG. 5B, and FIG. 5C are diagrams illustrating examples of the processes of manufacturing the wiring board according to one embodiment.
Figure 5B:
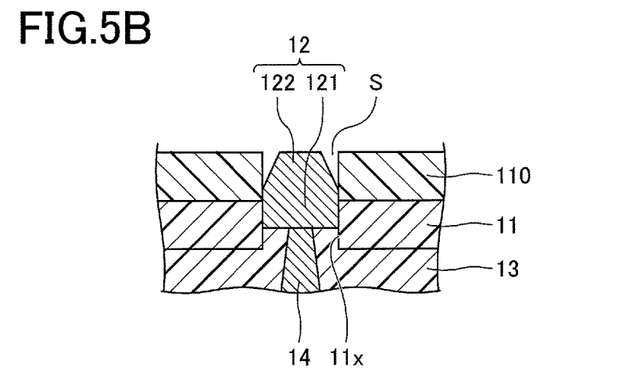

Next, in the process illustrated in FIG. 5A and FIG. 5B, the metal layer 103 illustrated in FIG. 4C is removed by wet etching. FIG. 5B is a partial enlarged view in the vicinity of the pad 12 illustrated in FIG. 5A.

As illustrated in FIG. 5B, a side-etch S is generated at the side of the pad 12 in contact with the metal layer 103 when the wet etching is performed. During the wet etching to remove the metal layer 103, the side-etch S is generated only at the side of the pad 12 in contact with the metal layer 103, and an outer peripheral portion of the upper surface of the pad 12 is removed, to form a taper at the upper surface of the pad 12. As a result, the pad 12 is formed to have a shape that includes the columnar section 121 having the approximately constant cross sectional area, and the tapered section 122 continuously formed on one end of the columnar section 121. The cross sectional area of the tapered section 122 decreases toward the direction away from the columnar section 121. The tip end of the tapered section 122 is flat. The columnar section 121 has the cylindrical shape, for example, and the tapered section 122 has the truncated cone shape, for example.

Figure 5C:
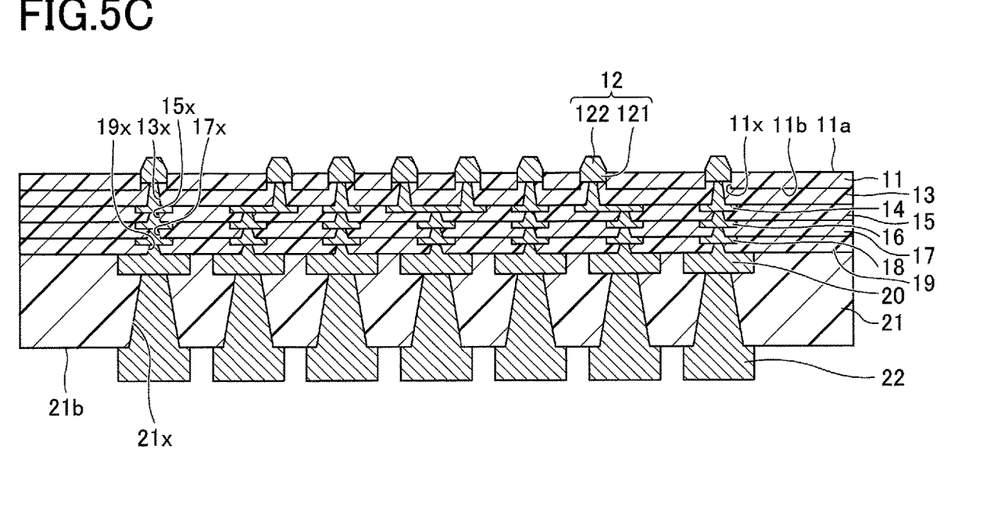

Next, in the process illustrated in FIG. 5C, the sacrificial layer 110 illustrated in FIG. 5A and FIG. 5B is removed. Because the side-etch S exists on the upper surface side of the pad 12 and the adhesion between the pad 12 and the sacrificial layer 110 is weakened thereby, it is possible to reduce a stress that is applied to the pad 12 when removing the sacrificial layer 110.

In the case where the sacrificial layer 110 is made of the photosensitive resin or the thermosetting resin, the sacrificial layer 110 can be removed by the desmear process or plasma etching, for example. In the case where the sacrificial layer 110 has the laminated structure including the ultraviolet curing release layer and the thermosetting resin layer, the ultraviolet curing release layer and the photosensitive resin layer can be removed simultaneously by irradiating ultraviolet ray on the sacrificial layer 110. By the removal of the sacrificial layer 110, a portion of the columnar section 121 is covered by the insulating layer 11, and other portions of the columnar section 121 and the tapered section 122 project from the upper surface 11a of the insulating layer 11. Hence, the wiring board 1 is completed by the processes described above.

It is not essential to perform the process of forming the insulating layer 11 illustrated in FIG. 2B. However, by forming the insulating layer 11, a portion of the columnar section 121 of the pad 12 is covered by the insulating layer 11, to generate the effect of preventing the pad 12 from falling off.

Figure 6A:
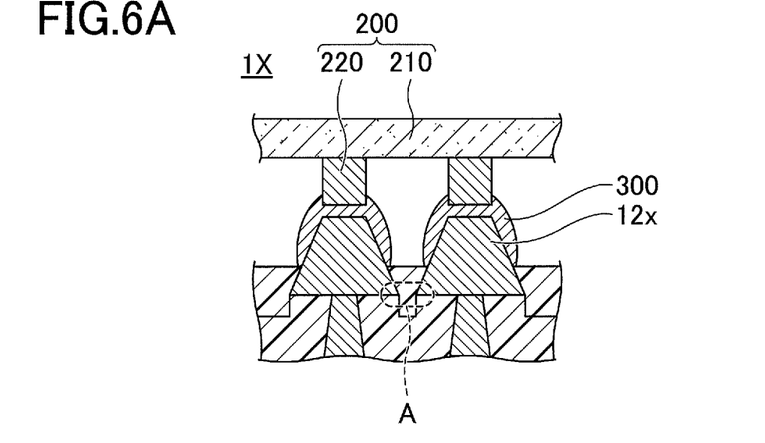
FIG. 6A, FIG. 6B, and FIG. 6C are diagrams for explaining advantages features of the wiring board according to one embodiment.
Figure 6B:
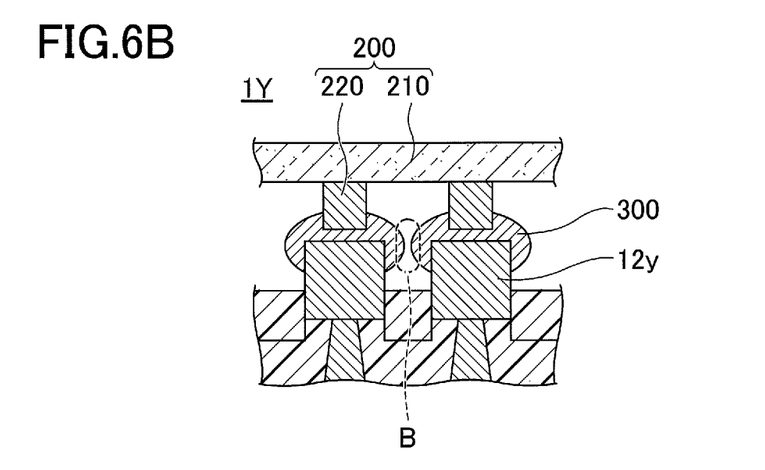
Figure 6C:
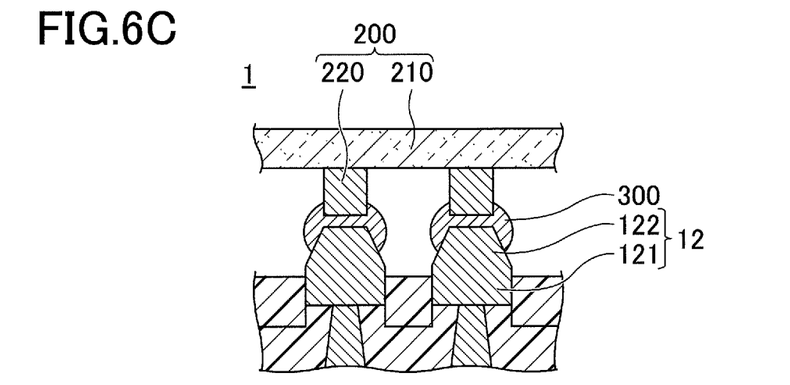

Next, advantageous features of the wiring board 1 will be described, in comparison with comparison examples. FIG. EA, FIG. 6B, and FIG. 6C are diagrams for explaining the advantages features of the wiring board 1 according to one embodiment. In FIG. 6A through FIG. 6C, a semiconductor chip 200 includes a semiconductor substrate 210, and projecting electrodes 220 formed on the semiconductor substrate 210. The semiconductor chip 200 is electrically connected to each of wiring boards 1X and 1Y according to comparison examples illustrated in FIGS. 6A and 6B, and the wiring board 1 according to one embodiment illustrated in FIG. 6C, via a solder 300.

In a first comparison example illustrated in FIG. 6A, the wiring board 1X includes pads 12x having a truncated cone shape. When the pads 12x having the truncated cone shape are arranged at a narrow pitch, concerns of the adjacent pads 12x short-circuiting at a part A increase.

In addition, in a second comparison example illustrated in FIG. 6B, the wiring board 1Y includes pads 12y having a cylindrical shape. When the pads 12y having the cylindrical shape are arranged at the narrow pitch, concerns of the adjacent solder 300 short-circuiting at a part B increase.

On the other hand, in the wiring board 1 according to one embodiment illustrated in FIG. 6C, each pad 12 is formed by the columnar section 121 having the approximately constant cross sectional area, and the tapered section 122 continuously formed on one end of the columnar section 121. The cross sectional area of the tapered section 122 decreases toward the direction away from the columnar section 121. The columnar section 121 has the cylindrical shape, for example, and the tapered section 122 has the truncated cone shape, for example. For this reason, concerns of the adjacent pads 12 short-circuiting decrease due to the provision of the columnar section 121. Further, even when the pads 12 are arranged at the narrow pitch, concerns of the adjacent solder 300 short-circuiting decrease due to the provision of the tapered section 122.

As described above, because the pad 12 of the wiring board 1 includes the columnar section 121 and the tapered section 122, it is possible to reduce the possibility of the adjacent pads 12 becoming short-circuited when mounting the semiconductor chip 200 on the wiring board 1, even when the pads 12 are arranged at the short pitch.

In addition, it is possible to reduce inconsistencies or unevenness of the heights of the pads 12, because the pads 12 are formed on the metal layer 103 of the substrate 100 having a high flatness, and the heights of the pads 12 are controlled by the thickness of the sacrificial layer 110. As a result, it is possible to improve the reliability of the electrical connection between the pads 12 and the electrodes 220 of the semiconductor chip 200.

Further, because the pad 12 includes the tapered section 122, biting or entrapment of voids is unlikely to occur when the semiconductor chip 200 is mounted on the wiring board 1 using the solder 300.

Accordingly to each of the embodiments described above, it is possible to provide a wiring board having pads that are shaped so that the possibility of short-circuiting the adjacent pads can be reduced when mounting a semiconductor chip.

Various aspects of the subject-matter described herein may be set out non-exhaustively in the following numbered clauses:

1. A method of manufacturing a wiring board having a semiconductor chip mounting surface, and an external connection surface provided on an opposite side from the semiconductor chip mounting surface, the method comprising:
preparing a substrate including a metal layer formed on a base, and foiling a sacrificial layer on an upper surface of the metal layer;
forming an opening penetrating the sacrificial layer and exposing the upper surface of the metal layer;
forming a pad on the upper surface of the metal exposed inside the opening, to project from the semiconductor chip mounting surface;
forming an insulating layer and an interconnect layer on a side closer to the external connection surface than the pad;
removing the base;
removing the metal layer by wet etching; and
removing the sacrificial layer,
wherein the wet etching generates a side-etch at a side of the pad in contact with the metal layer, to form the pad to a shape that includes a columnar section, and a tapered section continuously formed on a first end of the columnar section and having a cross sectional area decreasing toward a direction away from the columnar section.

2. The method of manufacturing the wiring board according to clause 1, wherein the wet etching forms the columnar section to a cylindrical shape, and forms the tapered section to a truncated cone shape.

3. The method of manufacturing the wiring board according to clause 1 or 2, further comprising:
forming a first insulating layer having a first surface that forms the semiconductor chip mounting surface, so that a portion of the pad, not having the tapered section, is embedded in the first insulating layer.

4. The method of manufacturing the wiring board according to clause 3, further comprising:
forming a second insulating layer having a third surface, and a fourth surface opposite to the third surface, so that the third surface makes contact with a second surface of the first insulating layer, opposite to the first surface of the first insulating layer; and
forming an interconnect layer including an interconnect pattern formed on the fourth surface of the second insulating layer, and a via interconnect formed integrally with the interconnect pattern and penetrating the second insulating layer to make contact with a second end of the columnar section opposite to the first end of the columnar section,
wherein the via interconnect has a tapered shape having a cross sectional area that decreases from the interconnect pattern toward the second end of the columnar section.

5. The method of manufacturing the wiring board according to clause 4, further comprising:
forming, in the first insulating layer, a recess that caves inward from the second surface, and includes a bottom surface formed by the second end of the columnar section; and
filling an inside of the recess with the second insulating layer.

6. The method of manufacturing the wiring board according to clause 5, wherein the forming the interconnect layer forms the via interconnect so as to penetrate the second insulating layer filling the inside of the recess, and make contact with the second end of the columnar section.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board comprising:
a first insulating layer having a first surface that forms a semiconductor chip mounting surface;
an external connection surface provided on an opposite side from the semiconductor chip mounting surface; and
a plurality of pads provided on the semiconductor chip mounting surface,
wherein each pad of the plurality of pads includes
a columnar section having a first end, a second end opposite to the first end, a first portion embedded in the first insulating layer, and a second portion connected to the first portion and projecting from the first surface, and
a tapered section, continuously formed on the first end of the columnar section, and having a cross sectional area that decreases from a third end toward a fourth end, opposite to the third end, in a direction away from the columnar section,
wherein the second portion has a projecting tip end forming the first end,
wherein the tapered section of each pad of the plurality of pads is continuously formed on the projecting tip end of the second portion and projects from the semiconductor chip mounting surface, and
wherein a cross sectional area of the columnar section at the first end thereof has a shape and a size identical to a shape and a size of the cross sectional area of the tapered section at the third end thereof.

2. The wiring board as claimed in claim 1, wherein the columnar section has a cylindrical shape.

3. The wiring board as claimed in claim 2, wherein the tapered section has a truncated cone shape.

4. The wiring board as claimed in claim 3,
wherein a portion of each pad of the plurality of pads, not having the tapered section, is embedded in the first insulating layer.

5. The wiring board as claimed in claim 1, wherein the tapered section has a truncated cone shape.

6. The wiring board as claimed in claim 1,
wherein a portion of each pad of the plurality of pads, not having the tapered section, is embedded in the first insulating layer.

7. The wiring board as claimed in claim 6, further comprising:
a second insulating layer having a third surface, and a fourth surface opposite to the third surface, wherein the third surface makes contact with a second surface of the first insulating layer, opposite to the first surface of the first insulating layer; and
an interconnect layer including an interconnect pattern formed on the fourth surface of the second insulating layer, and a via interconnect formed integrally with the interconnect pattern and penetrating the second insulating layer to make contact with the second end of the columnar section,
wherein the via interconnect has a tapered shape having a cross sectional area that decreases from the interconnect pattern toward the second end of the columnar section.

8. The wiring board as claimed in claim 7, wherein
the first insulating layer includes a recess that caves inward from the second surface, and includes a bottom surface formed by the second end of the columnar section, and
the second insulating layer fills an inside of the recess.

9. The wiring board as claimed in claim 8, wherein the via interconnect penetrates the second insulating layer filling the inside of the recess, and makes contact with the second end of the columnar section.

10. The wiring board as claimed in claim 9, wherein the first insulating layer and the second insulating layer are made of a material including a photosensitive insulating resin as a main component thereof.

11. The wiring board as claimed in claim 9, further comprising:
a third insulating layer having a fifth surface, and a sixth surface opposite to the fifth surface,
wherein the fifth surface makes contact with the fourth surface of the second insulating layer,
wherein the sixth surface forms the external connection surface, and
wherein the third insulating layer is made of a material including a nonphotosensitive thermosetting resin as a main component thereof.

12. The wiring board as claimed in claim 8, wherein the first insulating layer and the second insulating layer are made of a material including a photosensitive insulating resin as a main component thereof.

13. The wiring board as claimed in claim 8, further comprising:
a third insulating layer having a fifth surface, and a sixth surface opposite to the fifth surface,
wherein the fifth surface makes contact with the fourth surface of the second insulating layer,
wherein the sixth surface forms the external connection surface, and
wherein the third insulating layer is made of a material including a nonphotosensitive thermosetting resin as a main component thereof.

14. The wiring board as claimed in claim 7, wherein the first insulating layer and the second insulating layer are made of a material including a photosensitive insulating resin as a main component thereof.

15. The wiring board as claimed in claim 14, further comprising:
a third insulating layer having a fifth surface, and a sixth surface opposite to the fifth surface,
wherein the fifth surface makes contact with the fourth surface of the second insulating layer,
wherein the sixth surface forms the external connection surface, and
wherein the third insulating layer is made of a material including a nonphotosensitive thermosetting resin as a main component thereof.

16. The wiring board as claimed in claim 7, further comprising:
a third insulating layer having a fifth surface, and a sixth surface opposite to the fifth surface,
wherein the fifth surface makes contact with the fourth surface of the second insulating layer,
wherein the sixth surface forms the external connection surface, and
wherein the third insulating layer is made of a material including a nonphotosensitive thermosetting resin as a main component thereof.

17. The wiring board as claimed in claim 1, wherein the fourth end of the tapered section is flat.

* * * * *